United States Patent
Lee et al.

(10) Patent No.: US 8,748,888 B2
(45) Date of Patent: Jun. 10, 2014

(54) SEMICONDUCTOR INTEGRATED CIRCUIT

(75) Inventors: Jeong Woo Lee, Ichon-si (KR); Hyung Dong Lee, Ichon-si (KR); Jun Gi Choi, Ichon-si (KR); Sang Hoon Shin, Ichon-si (KR); Xiang Hua Cui, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 460 days.

(21) Appl. No.: 12/648,680

(22) Filed: Dec. 29, 2009

(65) Prior Publication Data

US 2011/0024743 A1 Feb. 3, 2011

(30) Foreign Application Priority Data

Jul. 30, 2009 (KR) .................. 10-2009-0070139

(51) Int. Cl.
*H01L 23/58* (2006.01)

(52) U.S. Cl.
USPC ...... 257/48; 257/774; 257/777; 257/E21.499; 257/E21.592

(58) Field of Classification Search
USPC ............... 257/48, 774, 777; 361/803
See application file for complete search history.

(56) References Cited

U.S. PATENT DOCUMENTS

| | | | |
|---|---|---|---|
| 5,654,588 A * | 8/1997 | Dasse et al. | 257/754 |
| 6,228,684 B1 * | 5/2001 | Maruyama | 438/113 |
| 7,541,203 B1 | 6/2009 | Knickerbocker | |
| 7,598,523 B2 | 10/2009 | Luo et al. | |
| 7,965,095 B2 * | 6/2011 | Shibata | 324/762.02 |
| 2006/0087021 A1 * | 4/2006 | Hirose | 257/686 |
| 2009/0032928 A1 | 2/2009 | Chiang et al. | |
| 2009/0039915 A1 * | 2/2009 | Ruckerbauer et al. | 326/38 |
| 2009/0135638 A1 | 5/2009 | Shimizu | |
| 2009/0168545 A1 | 7/2009 | Park et al. | |
| 2009/0224784 A1 * | 9/2009 | Pagani | 324/754 |
| 2010/0020583 A1 * | 1/2010 | Kang et al. | 365/51 |
| 2011/0034021 A1 * | 2/2011 | Feng et al. | 438/600 |
| 2011/0110064 A1 * | 5/2011 | Foster et al. | 361/803 |
| 2012/0208320 A1 * | 8/2012 | Barth et al. | 438/113 |
| 2013/0242500 A1 * | 9/2013 | Lin et al. | 361/679.32 |

FOREIGN PATENT DOCUMENTS

| | | | |
|---|---|---|---|
| JP | 09-69546 | * | 3/1997 |
| JP | 2007-258728 | * | 10/2007 |
| KR | 10-0155590 | | 7/1998 |
| KR | 100816758 B1 | | 3/2008 |

* cited by examiner

*Primary Examiner* — A. Sefer
(74) *Attorney, Agent, or Firm* — William Park & Associates Patent Ltd.

(57) ABSTRACT

A semiconductor integrated circuit includes a multi-chip package having a plurality of semiconductor chips. The semiconductor integrated circuit includes a signal line; and a signal loading compensation section in a semiconductor chip among the plurality of semiconductor chips, configured to apply a designed signal loading to the signal line in response to activation of a test signal. Here, the designed signal loading has a value corresponding to a signal loading component of another semiconductor chip among the plurality of semiconductor chips to the signal line.

7 Claims, 3 Drawing Sheets

SEMICONDUCTOR INTEGRATED CIRCUIT

CROSS-REFERENCE TO RELATED APPLICATION

The present application claims priority under 35 U.S.C. §119(a) to Korean Application No. 10-2009-0070139, filed on Jul. 30, 2009 in the Korean Intellectual Property Office, which is incorporated herein by reference in its entirety as if set forth in full.

BACKGROUND

1. Technical Field

The present invention relates to semiconductor circuit technology, and more particularly, to a semiconductor integrated circuit.

2. Related Art

As a semiconductor memory is highly integrated, necessity to enhance the memory capacity of a package has increased. As a way of enhancing the memory capacity of a package, a multi-chip package is widely used.

In the multi-chip package, a plurality of semiconductor chips (hereinafter simply referred to as "chips") should be electrically connected. Methods for electrically connecting the plurality of chips in the multi-chip package are divided into several categories, including a wire bonding type in which the plurality of chips are electrically connected using wires and a through-silicon via type in which the plurality of chips are electrically connected using silicon vias.

The plurality of chips constituting the multi-chip package are respectively tested at a wafer level using probes.

Since the chips are tested at a wafer level, signal loading at a multi-chip package level cannot be reflected.

Therefore, when the chips are tested at a wafer level, the reliability of test results is likely to deteriorate due to timing errors of signals, and the operational performance of the multi-chip package can be degraded.

SUMMARY

A semiconductor integrated circuit which can allow a test to be performed at a wafer level with a comparable precision as at a multi-chip package level is described herein.

In one aspect of the present invention, a semiconductor integrated circuit includes a multi-chip package having a plurality of semiconductor chips, comprising: a signal line in a semiconductor chip among the plurality of semiconductor chips; and a signal loading compensation section in the semiconductor chip among the plurality of semiconductor chips, configured to apply a designed signal loading to the signal line in response to activation of a test signal, wherein the designed signal loading has a value corresponding to signal loading components of other semiconductor chips among the plurality of semiconductor chips prearranged to constitute the multi-chip package.

In another aspect of the present invention, a semiconductor integrated circuit comprises: a plurality of semiconductor chips; and a via formed through the plurality of semiconductor chips to electrically connect the plurality of semiconductor chips together, wherein one of the plurality of semiconductor chips comprises a signal line and is configured to apply a designed signal loading corresponding to an actual signal loading of the via, to the signal line in response to a test signal.

In still another aspect of the present invention, a semiconductor integrated circuit comprises: a plurality of semiconductor chips; a wire configured to electrically connect the plurality of semiconductor chips together, wherein one of the plurality of semiconductor chips comprise a signal line, and is configured to apply a designed signal loading corresponding to an actual signal loading of the wire, to the signal line in response to a test signal.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through preferred embodiments.

Before describing embodiments of the invention in detail, it is to be noted that the present invention can allow signal loading of entire chips constituting a multi-chip package to be implemented when performing a test for one chip and can be applied to various kinds of multi-chip packages including a wire bonding type and a through-silicon via type.

Figure 1:
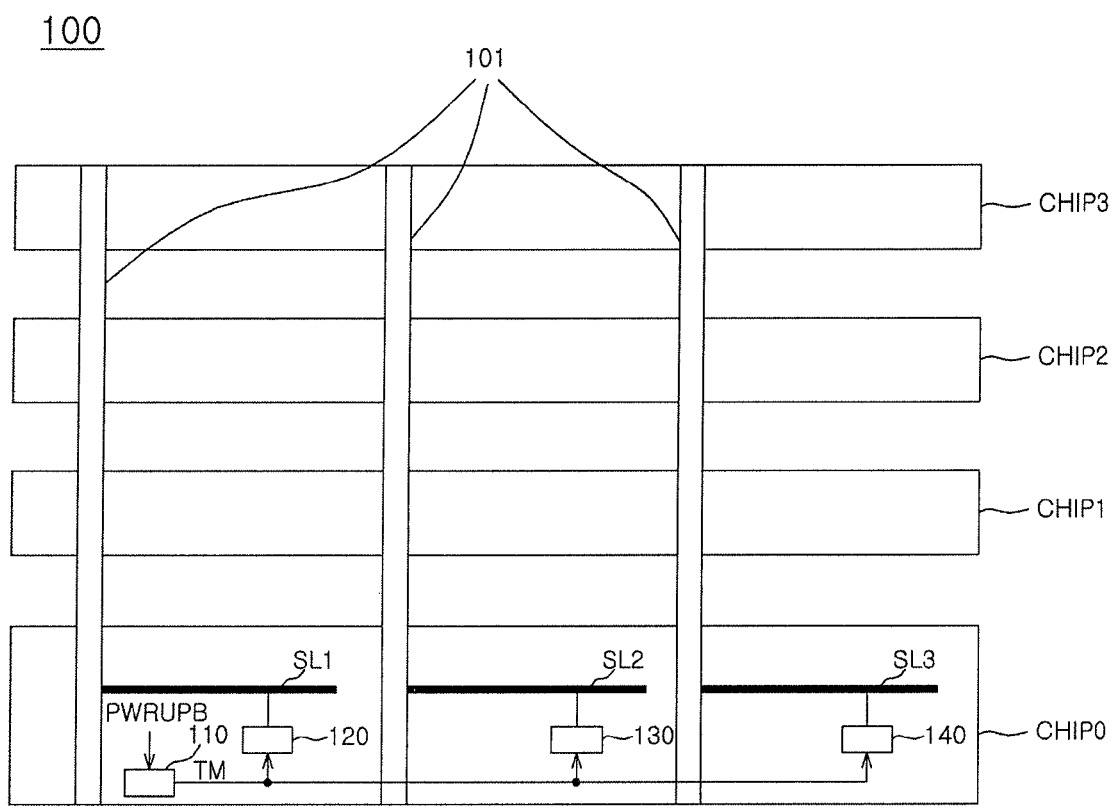
FIG. 1 is a layout diagram of a semiconductor integrated circuit of a through-silicon via type in accordance with an embodiment of the present invention.

Referring to FIG. 1, a semiconductor integrated circuit 100 in accordance with an embodiment of the present invention includes a plurality of chips CHIP0-CHIP3.

The plurality of chips CHIP0-CHIP3 can be classified, for example, into a master chip CHIP0 and slave chips CHIP1-CHIP3.

The master chip CHIP0 manages signal transmission and reception with an external device such as a testing equipment or a memory controller, and may have a memory region.

The major parts of the slave chips CHIP1-CHIP3 are memory regions, and the slave chips CHIP1-CHIP3 may have configuration for transmission and reception of signals.

Silicon vias 101 are formed through the plurality of chips CHIP0-CHIP3.

The semiconductor integrated circuit 100 includes, in one of the plurality of chips CHIP0-CHIP3, e.g., in the master chip CHIP0, a test signal generation section 110 and a plurality of signal loading compensation sections 120-140 as circuit components for implementing signal loading of the entire chips CHIP0-CHIP3 when performing a testing operation.

Figure 2:
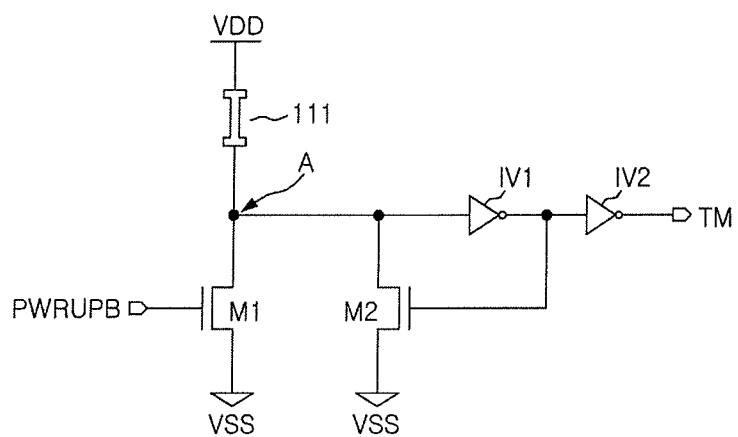
FIG. 2 is a circuit diagram of a test signal generation section shown in FIG. 1.

FIG. 2 is a circuit diagram of a test signal generation section shown in FIG. 1. As shown in FIG. 2, the test signal generation section 110 is configured to activate a test signal TM based on whether a fuse 111 is cut off or not and initialize the test signal TM to an inactivation level in response to a power-up signal PWRUPB.

The power-up signal PWRUPB indicates a power-up state in which a power voltage VDD supplied to the semiconductor integrated circuit 100 is stabilized above a target level. In the present invention, it is assumed that the power-up signal PWRUPB has a high level before the power-up state and a low level after the power-up state.

The test signal generation section 110 can be implemented by the fuse 111, a plurality of inverters IV1 and IV2, and a plurality of transistors M1 and M2.

In an initial operation of the test signal generation section 110 before the power-up state of the semiconductor integrated circuit 100, since the transistor M1 is turned on by the power-up signal PWRUPB of a high level, node A becomes a low level and the test signal TM is outputted at a low level. The test signal TM is maintained at the low level by the transistor M2 and the inverter IV1.

Since the transistor M1 is turned off by the power-up signal PWRUPB of a low level after the power-up state, if the fuse 111 is not cut off, the test signal TM transits to a high level. Meanwhile, if the power-up signal PWRUPB becomes a low level with the fuse 111 cut off, the test signal TM is continuously maintained at the low level.

In the present invention, a test signal TM can be provided from outside which is separate from the signal generation section 110. That is to say, a circuit configuration is made in a manner such that the test signal TM can be received from an external signal terminal of a completed multi-chip package and can be provided to the signal loading compensation sections 120-140.

The plurality of signal loading compensation sections 120-140 are respectively connected to signal lines SL1-SL3 and are configured in such a way as to internally realize capacitance values corresponding to signal loading components, e.g., capacitance values, of the silicon vias 101 respectively connected to the signal lines SL1-SL3. Here, each of the signal compensation sections 120-140 is configured to apply a designed signal loading to the signal line in response to the test signal TM. The plurality of signal loading compensation sections 120-140 are different from one another only in terms of capacitance values to be realized, and can be configured in a similar manner. Therefore, only the configuration of the signal loading compensation section 120 will be described below.

The signal lines SL1-SL3 are shown as parts of entire signal lines, and can include a data line, a control line and a power line.

Figure 3:
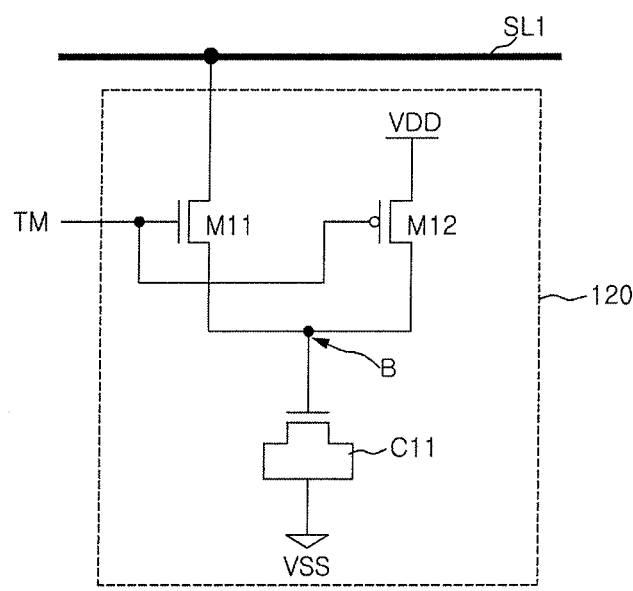
FIG. 3 is a circuit diagram of a signal loading compensation section shown in FIG. 1.

FIG. 3 is a circuit diagram of a signal loading compensation section shown in FIG. 1. Referring to FIG. 3, the signal loading compensation section 120 can be implemented by a plurality of transistors M11 and M12 and a capacitor C11.

A drain of the transistor M11 is connected to the signal line SL1, a source is connected to node B, and a gate receives the test signal TM.

On the other hand, a source of the transistor M12 receives the power voltage VDD, a drain is connected to node B, and a gate receives the test signal TM.

The capacitor C11 is connected to node B at one end and grounded at the other end.

The capacitance values of the capacitors C11 of the plurality of respective signal loading compensation sections 120-140 can be set to be the same or different from one another in consideration of capacitance of the silicon vias 101 connected to the signal lines SL1-SL3 and coupling capacitance.

Operations of the semiconductor integrated circuit 100 in accordance with the embodiment of the present invention, configured as mentioned above, will be described below.

While the semiconductor integrated circuit of FIG. 1 is illustrated in the form of a completely manufactured multi-chip package, a test for the master chip CHIP0 at a wafer level (hereafter referred to as a "wafer test") is performed solely for the master chip CHIP0 in a state in which the silicon vias 101 are not formed.

While the wafer test is performed, the fuse 111 of the test signal generation section 110 shown in FIG. 2 is kept uncut.

Thus after power-up of the semiconductor integrated circuit 100, the test signal TM is applied to all the signal loading compensation sections 120-140 at a high level.

Since the test signal TM is a high level, the transistors M11 of all the signal loading compensation sections 120-140 are turned on, and the transistors M12 are turned off.

As the transistors M11 are turned on, the capacitors C11 are connected to the signal lines SL1-SL3 and serve as loading of the signal lines SL1-SL3. In this state, the wafer test is performed.

In other words, although it is the norm that the wafer test is performed for only the master chip CHIP0 with the silicon vias 101 is not formed, in the embodiment of the present invention, it is possible to provide a comparable or same signal loading circumstances as in the case of the multi-chip package in which the master chip CHIP0 and the slave chips CHIP1-CHIP3 are electrically connected through the silicon vias 101.

After the wafer test is performed, the fuse 111 of the test signal generation section 110 shown in FIG. 2 is cut off, and the silicon vias 101 are formed in the master chip CHIP0 and the slave chips CHIP1-CHIP3. Then, by conducting the other processes, the manufacture of the multi-chip package as shown in FIG. 1 is completed.

In the state of the multi-chip package, after power-up, the test signal TM is locked at a low level as described above.

Since the test signal TM has a low level, the transistors M11 of all the signal loading compensation sections 120-140 are turned off, and the transistors M12 are turned on.

As the transistors M11 are turned off, the capacitors C11 are electrically disconnected from the signal lines SL1-SL3 and do not serve any more as loading of the signal lines SL1-SL3.

As the transistors M12 are turned on, the power voltage VDD is applied to the capacitors C11 to prevent the capacitors C11 from floating.

Namely, in the present invention, in a normal operation after the wafer test, since actual signal loading by the silicon vias 101 formed in the master chip CHIP0 and the slave chips CHIP1-CHIP3 is is effected, additional signal loading by the capacitors C11 is prevented.

Figure 4:
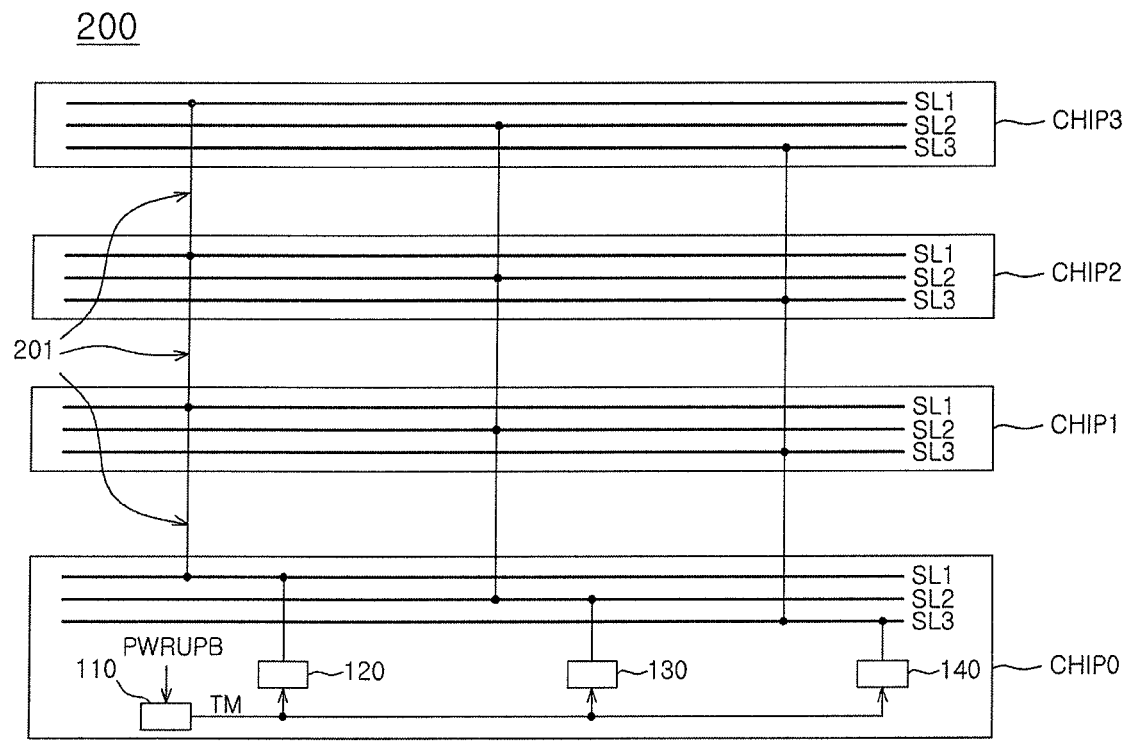
FIG. 4 is a layout diagram of a semiconductor integrated circuit of a wire bonding type in accordance with another embodiment of the present invention.

FIG. 4 is a layout diagram of a semiconductor integrated circuit of a wire bonding type in accordance with another embodiment of the present invention. Referring to FIG. 4, the wafer testing scheme according to the present invention can also be adopted in a semiconductor integrated circuit 200 of a wire bonding type.

In the semiconductor integrated circuit 200 of a wire bonding type in accordance with another embodiment of the present invention, in place of silicon vias, the same signal lines SL1-SL3 of a master chip CHIP0 and slave chips CHIP1-CHIP3 are electrically connected with one another by means of wires 201.

Even in the semiconductor integrated circuit 200 of a wire bonding type, a wafer test is performed only for the master chip CHIP0 in a state in which the wires 201 are not formed.

Hence, similar to the master chip CHIP0 shown in FIG. 1, by configuring a test signal generation section 110 and a plurality of signal loading compensation sections 120-140, when performing the wafer test, it is possible to provide a comparable or same signal loading circumstances as in the case of the multi-chip package in which the master chip CHIP0 and the slave chips CHIP1-CHIP3 are electrically connected through the wires 201.

Meanwhile, in the semiconductor integrated circuit according to the present invention, as the occasion demands, a test can be performed even after the manufacture of the multi-chip package is completed. That is to say, after the test signal TM outputted from the test signal generation section 110 is inactivated to a low level, a test signal can be provided from outside to the signal loading compensation sections 120-140 such that the signal loading compensation sections 120-140 are activated.

While certain embodiments have been described above, it will be understood to those skilled in the art that the embodiments described are by way of example only Accordingly, the semiconductor integrated circuits described herein should not be limited based on the described embodiments. Rather, the semiconductor integrated circuits described herein should only be limited in light of the claims that follow when taken in conjunction with the above description and accompanying drawings.

What is claimed is:

1. A semiconductor integrated circuit including a multi-chip package having a plurality of semiconductor chips, comprising:
    a signal line in a semiconductor chip among the plurality of semiconductor chips; and
    a signal loading compensation section in the semiconductor chip among the plurality of semiconductor chips, configured to apply a designed signal loading to the signal line in response to activation of a test signal,
    wherein the designed signal loading has a value corresponding to signal loading components of other semiconductor chips among the plurality of semiconductor chips prearranged to constitute the multi-chip package.

2. The semiconductor integrated circuit according to claim 1, wherein the signal loading components comprise silicon via.

3. The semiconductor integrated circuit according to claim 1, wherein the signal loading components comprise wire.

4. The semiconductor integrated circuit according to claim 1, wherein the signal loading compensation section comprises:
    a capacitor configured to provide the designed signal loading; and
    a switching element configured to connect the capacitor to the signal line in response to the activation of the test signal.

5. The semiconductor integrated circuit according to claim 4, wherein the signal loading compensation section further comprises:
    a switching element configured to apply a power voltage to the capacitor in response to inactivation of the test signal.

6. The semiconductor integrated circuit according to claim 1, further comprising:
    a fuse; and
    a test signal generation section configured to generate the test signal based on a power-up signal and a cut off or uncut state of the fuse.

7. The semiconductor integrated circuit according to claim 1, wherein the test signal is supplied from outside of the semiconductor chip.

* * * * *